United States Patent [19]
Greiff et al.

[11] Patent Number: 5,216,490
[45] Date of Patent: Jun. 1, 1993

[54] BRIDGE ELECTRODES FOR MICROELECTROMECHANICAL DEVICES

[75] Inventors: Paul Greiff, Wayland; Jonathan J. Bernstein, Medfield, both of Mass.

[73] Assignee: Charles Stark Draper Laboratory, Inc., Cambridge, Mass.

[21] Appl. No.: 562,581

[22] Filed: Aug. 3, 1990

Related U.S. Application Data

[63] Continuation-in-part of Ser. No. 314,453, Feb. 22, 1989, Pat. No. 5,060,039, and a continuation-in-part of Ser. No. 372,653, May 28, 1989, abandoned, and a continuation-in-part of Ser. No. 479,854, Feb. 14, 1990, which is a continuation-in-part of Ser. No. 143,515, Jan. 13, 1988, abandoned, and a continuation-in-part of Ser. No. 493,327, Mar. 14, 1990, Pat. No. 5,016,072, which is a continuation-in-part of Ser. No. 143,515, Jan. 13, 1988, abandoned.

[51] Int. Cl.$^5$ .......................................... H01L 29/84
[52] U.S. Cl. .................. 73/517 R; 257/659; 257/415
[58] Field of Search .............. 357/25, 26, 65, 53, 357/52; 338/4

[56] References Cited

U.S. PATENT DOCUMENTS

| | | | |
|---|---|---|---|
| 3,053,095 | 9/1962 | Koril et al. | 73/504 |
| 3,251,231 | 5/1966 | Hunt et al. | 73/505 |
| 3,370,458 | 2/1968 | Dillon | 73/141 |
| 3,890,177 | 6/1975 | Pfahnl et al. | 437/189 |
| 3,913,035 | 10/1975 | Havens | 331/107 R |
| 4,044,305 | 8/1977 | Oberbeck | 324/154 R |
| 4,234,666 | 11/1980 | Gursky | 428/573 |
| 4,321,500 | 3/1982 | Paros et al. | 310/321 |
| 4,342,227 | 8/1982 | Petersen et al. | 73/510 |
| 4,381,672 | 5/1983 | O'Connor et al. | 73/505 |
| 4,406,992 | 9/1983 | Kurtz et al. | 338/2 |
| 4,411,741 | 10/1983 | Janata | 204/1 T |
| 4,447,753 | 5/1984 | Ochiai | 310/312 |
| 4,468,584 | 8/1984 | Nakamura et al. | 310/370 |
| 4,478,076 | 10/1984 | Bohrer | 73/204 |
| 4,478,077 | 10/1984 | Bohrer et al. | 73/204 |
| 4,483,194 | 11/1984 | Rudolf | 73/517 R |
| 4,484,382 | 11/1984 | Kawashima | 29/25.35 |
| 4,490,772 | 12/1984 | Blickstein | 361/281 |
| 4,495,499 | 1/1985 | Richardson | 343/5 DD |

(List continued on next page.)

FOREIGN PATENT DOCUMENTS

| | | | |
|---|---|---|---|
| 55-121728 | 9/1980 | Japan | 310/367 |
| 58-136125 | 8/1983 | Japan | 310/367 |

(List continued on next page.)

OTHER PUBLICATIONS

"A Vibratory Micromechanical Gyroscope", Boxenhorn et al., AIAA Guidance, Navigation and Control Conference, Aug. 15–17, 1988, pp. 1033–1040.

(List continued on next page.)

Primary Examiner—Andrew J. James
Assistant Examiner—Courtney A. Bowers
Attorney, Agent, or Firm—Weingarten, Schurgin, Gagnebin & Hayes

[57] ABSTRACT

A bridge electrode structure and method of fabrication thereof is provided that is adapted to provide electrically isolated metal bridges over the active portions of a monolithic micromechanical transducer. The bridge electrode of the invention is also adapted to operate in facing relationship with one or more buried electrodes, providing top-to-bottom symmetry for balanced application of forces, or motion detection when used in conjunction with transducer elements. The transducer, typically a gyroscope or an accelerometer, includes a semiconductor substrate and active elements etched out of the substrate, the active elements including flexure-supported transducer plates. The bridge electrodes are anchored at opposing points on the substrate's surface to metal layers used to facilitate their electro-forming. The central portions of the bridge are electroplated over an insulating spacer, such as a photoresist layer.

12 Claims, 14 Drawing Sheets

U.S. PATENT DOCUMENTS

| | | | |
|---|---|---|---|
| 4,499,778 | 2/1985 | Westhaver et al. | 74/5 F |
| 4,502,042 | 2/1985 | Wuhrl et al. | 340/568 |
| 4,522,072 | 6/1985 | Sulouff et al. | 73/765 |
| 4,524,619 | 6/1985 | Staudte | 73/505 |
| 4,538,461 | 9/1985 | Juptner et al. | 73/505 |
| 4,585,083 | 4/1986 | Nishiguchi | 177/229 |
| 4,592,242 | 6/1986 | Kempas | 74/5 F |
| 4,596,158 | 6/1986 | Strugach | 74/5 F |
| 4,598,585 | 7/1986 | Boxenhorn | 73/505 |
| 4,600,934 | 7/1986 | Aine et al. | 357/26 |
| 4,619,001 | 10/1986 | Kane | 455/192 |
| 4,621,925 | 11/1986 | Masuda et al. | 356/350 |
| 4,628,283 | 12/1986 | Reynolds | 331/68 |
| 4,629,957 | 12/1986 | Walters et al. | 318/662 |
| 4,639,690 | 1/1987 | Lewis | 331/96 |
| 4,644,793 | 2/1987 | Church | 73/505 |
| 4,651,564 | 3/1987 | Johnson et al. | 73/204 |
| 4,653,326 | 3/1987 | Danel et al. | 73/517 R |
| 4,654,663 | 3/1987 | Alsenz et al. | 340/870.3 |
| 4,665,605 | 5/1987 | Kempas | 29/434 |
| 4,670,092 | 6/1987 | Motamedi | 156/643 |
| 4,671,112 | 6/1987 | Kimura et al. | 73/505 |
| 4,674,180 | 6/1987 | Zavracky et al. | 29/622 |
| 4,674,319 | 6/1987 | Muller et al. | 73/23 |
| 4,679,434 | 7/1987 | Stewart | 73/517 B |
| 4,680,606 | 7/1987 | Knutti et al. | 357/26 |
| 4,699,006 | 10/1987 | Boxenhorn | 73/517 |
| 4,705,659 | 11/1987 | Bernstein et al. | 264/29.6 |
| 4,706,374 | 11/1987 | Murakami | 437/225 |
| 4,712,439 | 12/1987 | North | 74/84 R |
| 4,736,629 | 4/1988 | Cole | 73/517 R |
| 4,743,789 | 5/1988 | Puskas | 310/316 |
| 4,744,248 | 5/1988 | Stewart | 73/505 |
| 4,744,249 | 5/1988 | Stewart | 73/505 |
| 4,747,312 | 5/1988 | Herzl | 73/861.38 |
| 4,750,364 | 6/1988 | Kawamura et al. | 73/510 |
| 4,764,244 | 8/1988 | Chitty et al. | 156/630 |
| 4,776,924 | 10/1988 | Delapierre | 156/647 |
| 4,783,237 | 11/1988 | Aine et al. | 437/15 |
| 4,789,803 | 12/1988 | Jacobsen et al. | 310/309 |
| 4,792,676 | 12/1988 | Hojo et al. | 250/231 |
| 4,805,456 | 2/1989 | Howe et al. | 73/517 |
| 4,808,948 | 2/1989 | Patel et al. | 331/4 |
| 4,851,080 | 7/1989 | Howe et al. | 156/647 |
| 4,855,544 | 8/1989 | Glenn | 200/61.45 |
| 4,857,481 | 8/1989 | Tam et al. | 437/182 |
| 4,869,107 | 9/1989 | Murakami et al. | 73/517 R |
| 4,882,933 | 11/1989 | Petersen et al. | 73/517 R |
| 4,884,446 | 12/1989 | Ljung | 73/505 |
| 4,890,812 | 1/1990 | Chechile et al. | 248/674 |
| 4,893,509 | 1/1990 | MacIver et al. | 73/517 |
| 4,899,587 | 2/1990 | Staudte | 73/505 |
| 4,900,971 | 2/1990 | Kawashima | 310/361 |
| 4,901,586 | 2/1990 | Blake et al. | 73/862.59 |
| 4,916,520 | 4/1990 | Kurashima | 357/68 |
| 5,001,383 | 3/1991 | Kawashima | 310/367 |
| 5,016,072 | 5/1991 | Greiff | 357/25 |
| 5,060,039 | 10/1991 | Weinberg et al. | 357/26 |
| 5,126,812 | 6/1992 | Greiff | 357/26 |

FOREIGN PATENT DOCUMENTS

| | | | |
|---|---|---|---|
| 59-37722 | 3/1984 | Japan | 310/367 |
| 59-158566 | 9/1984 | Japan | 29/84 |
| 61-144576 | 7/1986 | Japan | 15/09 |
| 62-71256 | 4/1987 | Japan | 27/16 |
| 62-221164 | 9/1987 | Japan | 29/84 |
| 63-169078 | 7/1988 | Japan | 29/84 |
| 2183040 | 5/1987 | United Kingdom | 15/2 |

OTHER PUBLICATIONS

"Monolithic Silicon Accelerometer", Boxenhorn et al., Transducers '89, Proceedings of the 5th Int'l Conference on Solid-State Sensors . . ., Jun. 25–30, 1989, pp. 273–277.

"An Electrostatically Rebalanced Micromechanical Accelerometer", Boxenhorn et al., AIAA Guidance, Navigation and Control Conference, Aug. 14–16, 1989, pp. 118–122.

"The Micromechanical Inertial Guidance System and Its Application", Boxenhorn et al., 14th Biennial Guidance Test Symposium, Oct. 3–5, 1989, pp. 113–131.

"Tensometric Accelerometers with Overload Protection", Moskalik, Meas. Tech., (USA) vol. 22, No. 12, (May 1980), pp. 1469–1471.

"Micromechanical Accelerometer Integrated with MOS Detection Circuitry", Petersen et al., IEEE Transactions on Electron Devices, vol. Ed-29, No. (Jan. 1982), pp. 23–27.

"Quartz Rate Sensor Replaces Gyros", Defense Electronics, Nov. 1984, p. 177.

"A Monolithic Silicon Accelerometer with Integral Air Damping and Overrange Protection", Barth et al., IEEE 1988, pp. 35–38.

"Silicon As A Mechanical Material", Peterson et al., Proceedings of the IEEE, vol. 70, No. 5, May 1982, pp. 420–457.

"Machining In the Micro Domain", Rosen, Mechanical Engineering, Mar. 1989, pp. 40–46.

"Silicon micromechanics: sensors and actuators on a chip", Howe et al., IEEE Spectrum, Jul 1990, pp. 29–35.

M. Nakamura et al., "Novel Electromechanical Micro-Machining and Its Application for Semiconductor Acceleration Sensor IC", Digest of Technical Papers (1987), Institute of Electrical Engineers of Japan, pp. 112–115.

BRIDGE ELECTRODES FOR MICROELECTROMECHANICAL DEVICES

CROSS-REFERENCE TO RELATED APPLICATIONS

This is a continuation-in-part application of U.S. Pat. application Ser. No. 07/314,453 (now U.S. Pat. No. 5,060,039), filed Feb. 22, 1989 (CSDL-099XX), U.S. application Ser. No. 07/372,653, filed Jun. 28, 1989 (CSDL-191XX) (now abandoned), U.S. application Ser. No. 07/479,854 filed Feb. 15, 1990 (pending) which is a continuation-in-part of U.S. application Ser. No. 07/143,515 filed Jan. 13, 1988 (now abandoned), and U.S. application Ser. No. 07/493,327 filed Mar. 14, 1990 (now U.S. Pat. No. 5,016,072), which is a continuation-in-part of U.S. application Ser. No. 07/143,515 filed Jan. 13, 1988 (now abandoned).

FIELD OF THE INVENTION

This invention relates to electrodes suspended over monolithic micromechanical devices.

BACKGROUND OF THE INVENTION

Conventional electrodes for monolithic micromechanical transducers consist of an electrode structure on a separate substrate or doped regions within the same silicon substrate that houses the transducer, at least partly bounded by a PN junction. In a buried electrode structure that comprises a region of P+ semiconductor material in an N-type silicon substrate, over which an N-type layer is grown and into which the transducer is formed.

Buried electrodes have a large parasitic capacitance to the substrate. Furthermore, the parasitic capacitance is voltage dependent, creating nonlinear errors. Such electrodes also exhibit a small leakage current. The maximum voltage that a buried electrode can withstand is the reverse breakdown voltage of the PN junction formed by it, typically about 40 volts. Buried electrodes must be disposed parallel to each other within the same plane so that they cannot be oriented in orthogonal relationships with respect to each other, as required by some applications.

Examples of prior systems are illustrated in commonly assigned copending U.S. application Ser. No. 07/314,453, filed Feb. 22, 1989 (CSDL-099XX), and U.S. Pat. No. 4,044,305.

SUMMARY OF THE INVENTION

A bridge electrode structure and method of fabrication thereof is provided that is adapted to provide electrically isolated metal bridges over the surface of a micromechanical transducer. The bridge electrodes of the invention are also adapted to operate in facing relationship with one or more buried electrodes, providing top-to-bottom symmetry for balanced application of forces or motion detection when used in conjunction with a transducer element. The transducer, typically a gyroscope or an accelerometer, includes a substrate etched in a central region to leave a monolithic, motionally restrained transducer element suspended therein. Bridge electrodes, anchored at electrically isolated opposite points on the substrate' surface, extend over the transducer element.

Bridge electrodes provide the advantage of a high breakdown voltage, low parasitic capacitance, and low leakage current. The capacitance of a bridge electrode is independent of electrode voltage, thereby avoiding potentially undesirable nonlinearities and resulting harmonics. Furthermore, bridge electrodes lend themselves for use in conjunction with electrical shielding. Additionally, complex, closely spaced multiple patterns can be achieved, and smaller gaps between an electrode and a transducer can be executed. Photolithographic processing steps are used for the fabrication of the bridge electrodes on a smooth surface of monolithic crystalline silicon. The electrodes are electroplated gold over a metallized photoresist including substrate footings.

BRIEF DESCRIPTION OF THE DRAWINGS

The invention will be more fully by reading the following detailed description, in conjunction with the following drawings, in which.

DETAILED DESCRIPTION OF THE INVENTION

Figure 1:
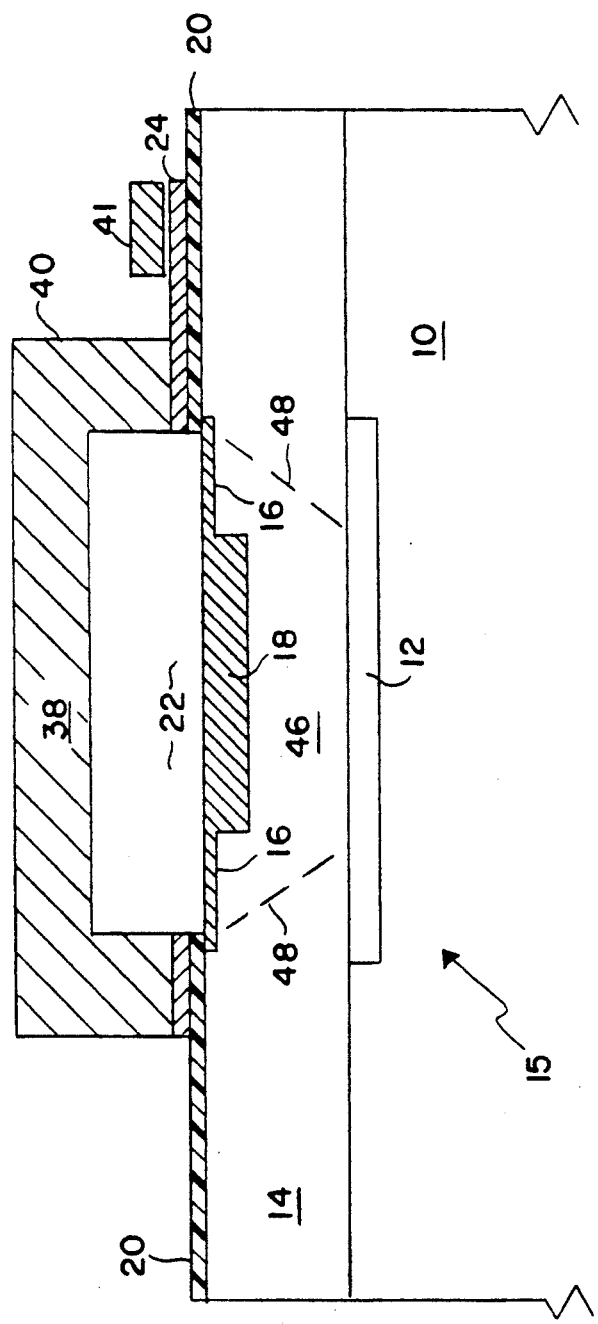
FIG. 1 is a sectional view of a micromechanical transducer with a plated bridge electrode according to the invention.
Figure 3:
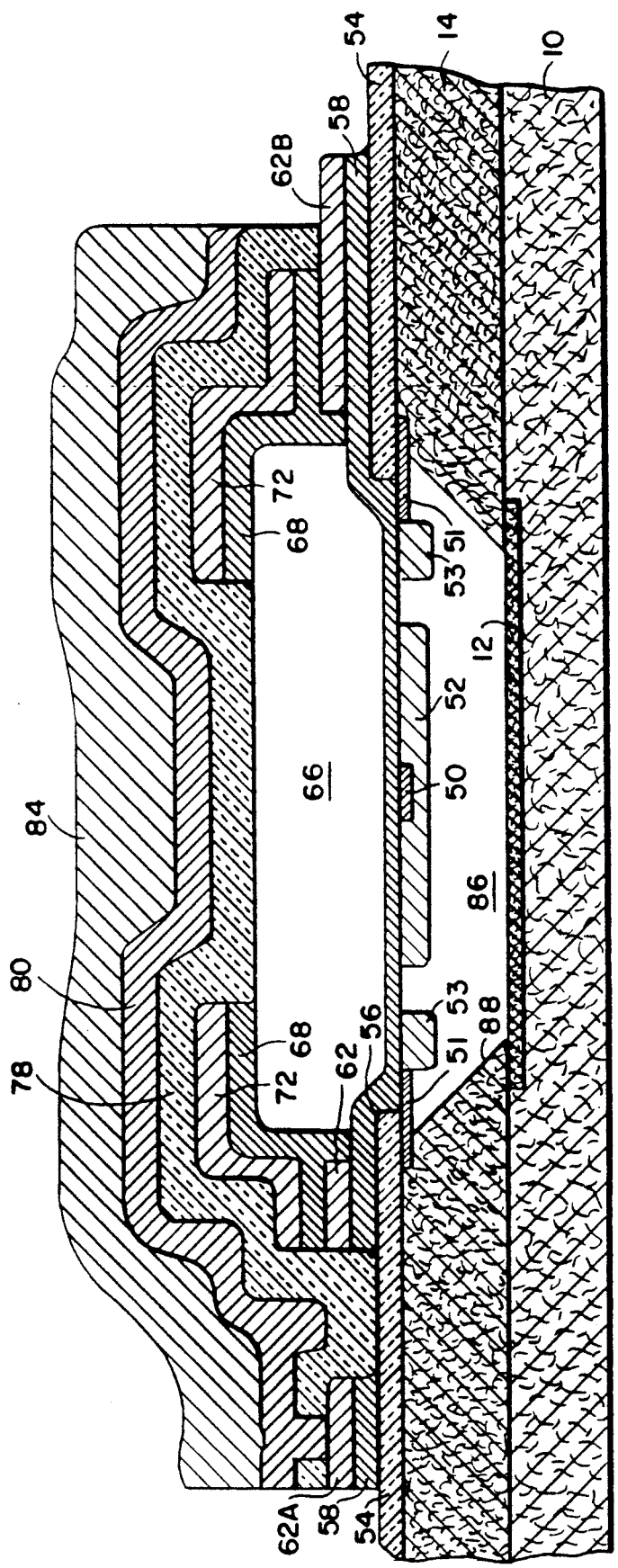
FIG. 3 is a sectional view of a multilayer bridge electrode.
Figure 8:
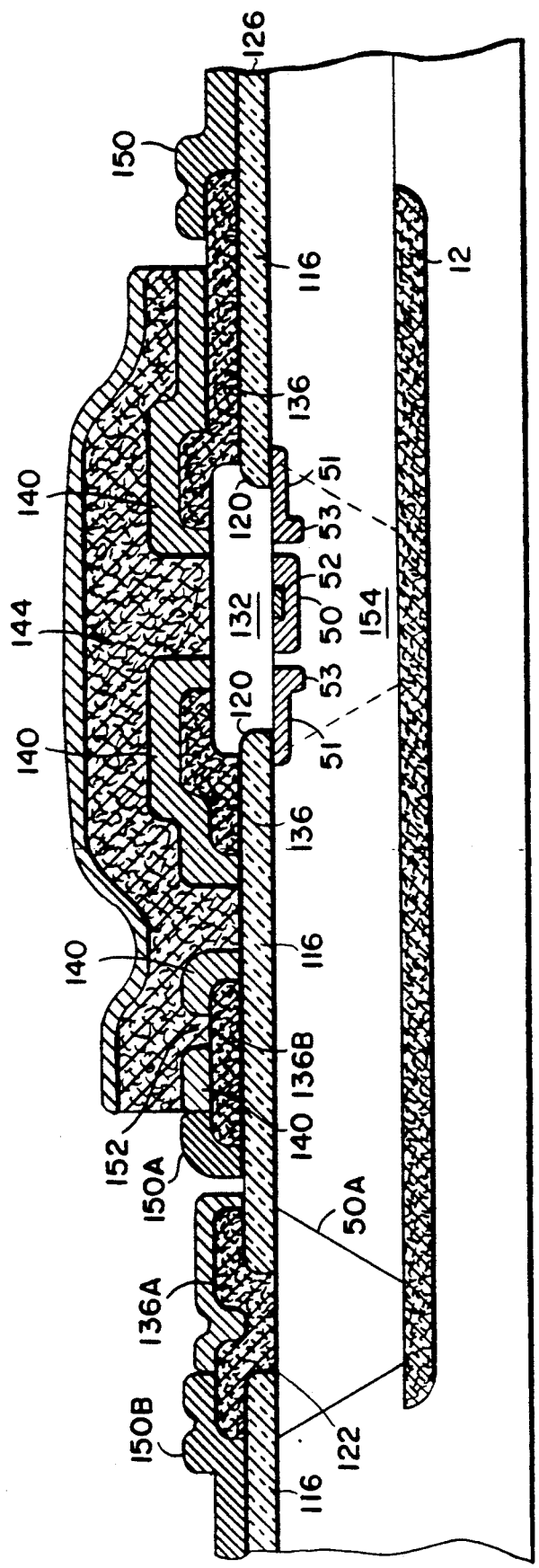
FIG. 8 is a sectional view of a multilayer polysilicon bridge electrode.

The bridge electrode structure of the invention will be described for use with a typical microelectromechanical accelerometer device as shown in FIG. 1. Also herein disclosed is the bridge electrode of the invention for use in conjunction with a microelectromechanical gyroscope, as shown in FIGS. 3 and 8. The invention is not limited to use with only these particular devices; it can be used in conjunction with any microelectromechanical device which could benefit from the inclusion of the invention.

Referring to FIG. 1, the bridge electrode structure of the invention is adapted to operate over the active elements of a micromechanical transducer 15 including the transducer element 18. The bridge electrode of the invention is also adapted to operate in facing relationship with one or more buried electrodes 12 to provide top-to-bottom symmetry for balanced application of forces to the transducer element 18, or any other transducer element. The bridge electrode of the invention can also be used for motion detection of a transducer element.

The transducer 15, shown here as an accelerometer, includes an epitaxially grown substrate 14 over buried electrodes 12 and etched in a central region to release and flexibly suspend the transducer element 18 therein. One or more bridge electrodes 38, anchored at opposing points on the surface of the substrate 14, extend over the transducer element 18.

Figure 10:
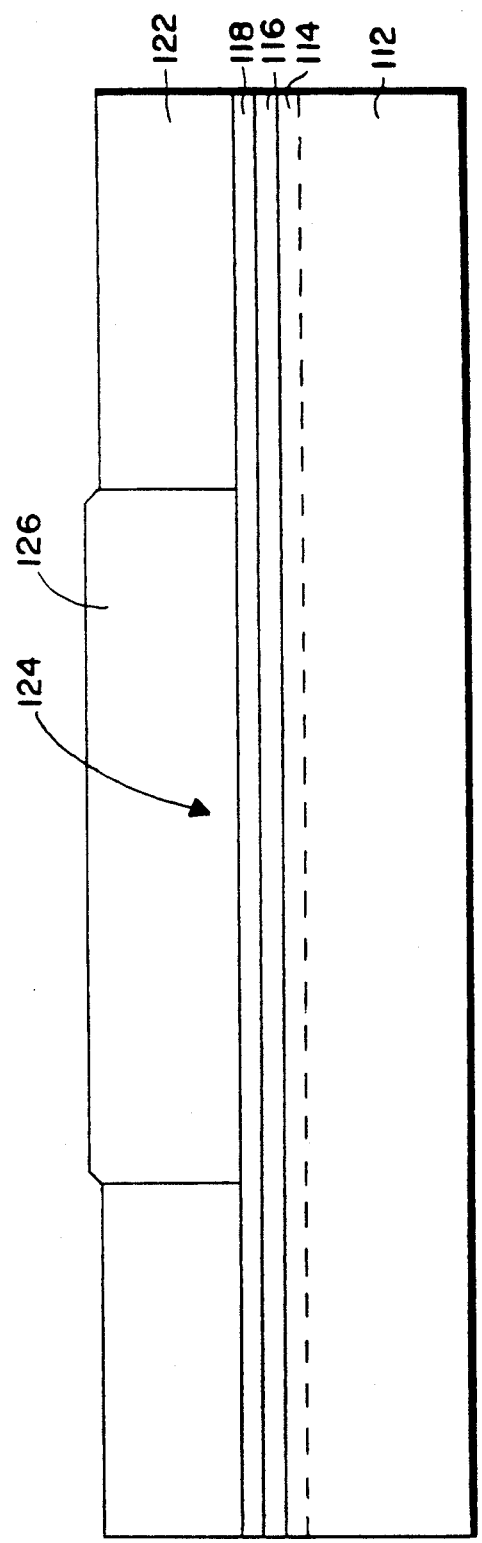
FIG. 10 illustrates in detail generic multilayer metallization structure on a silicon substrate.
Figure 11:
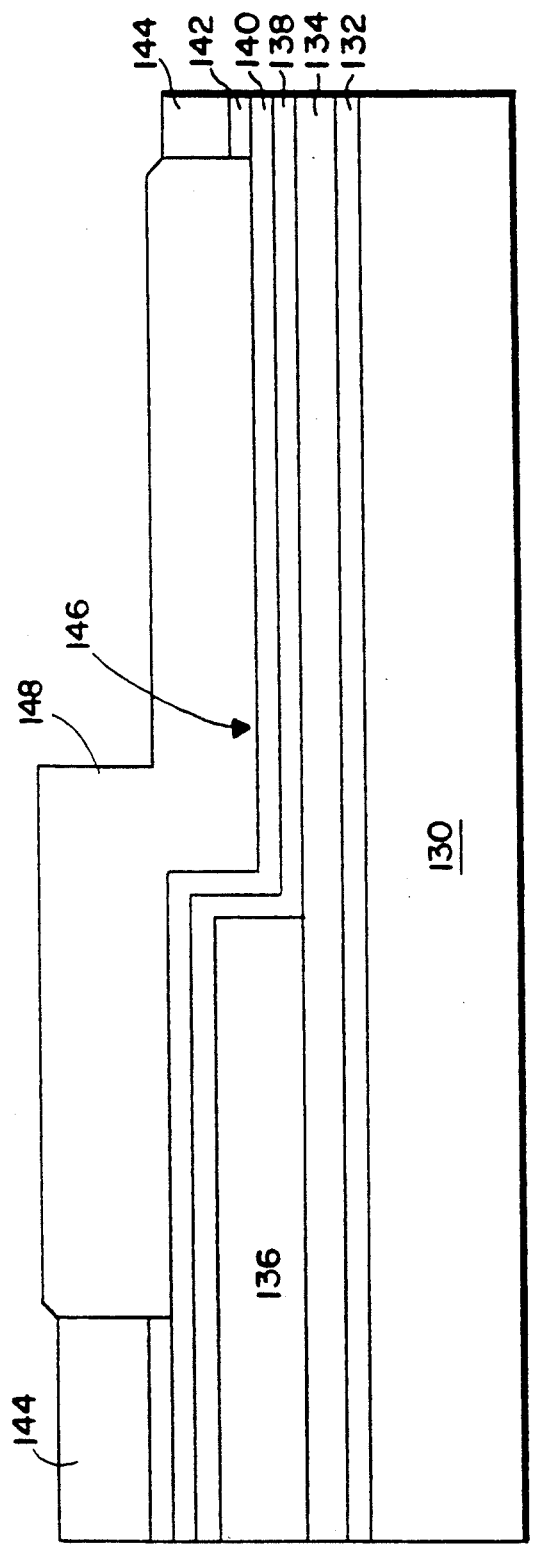
FIG. 11 illustrates a generic multilayer metallization structure with a thick structural metal section spaced from an underlying silicon substrate prior to its liberation.
Figure 12:
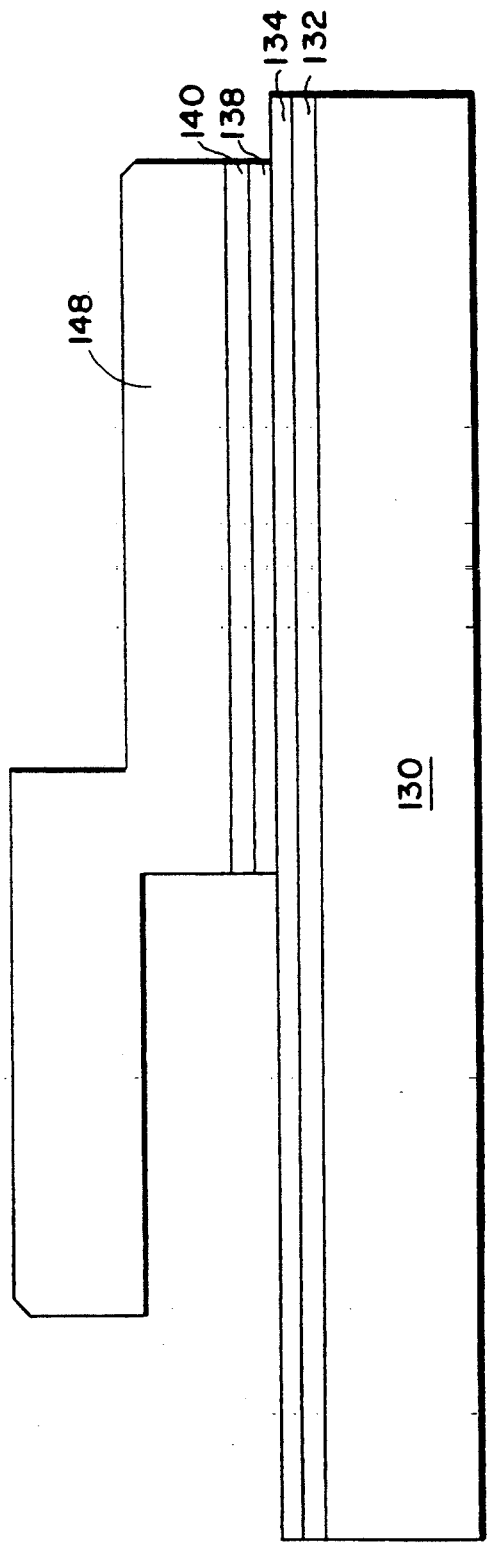
FIG. 12 illustrates the thick structural metal section of FIG. 11 after removal of intermediate structure used in its formation.
Figure 13:
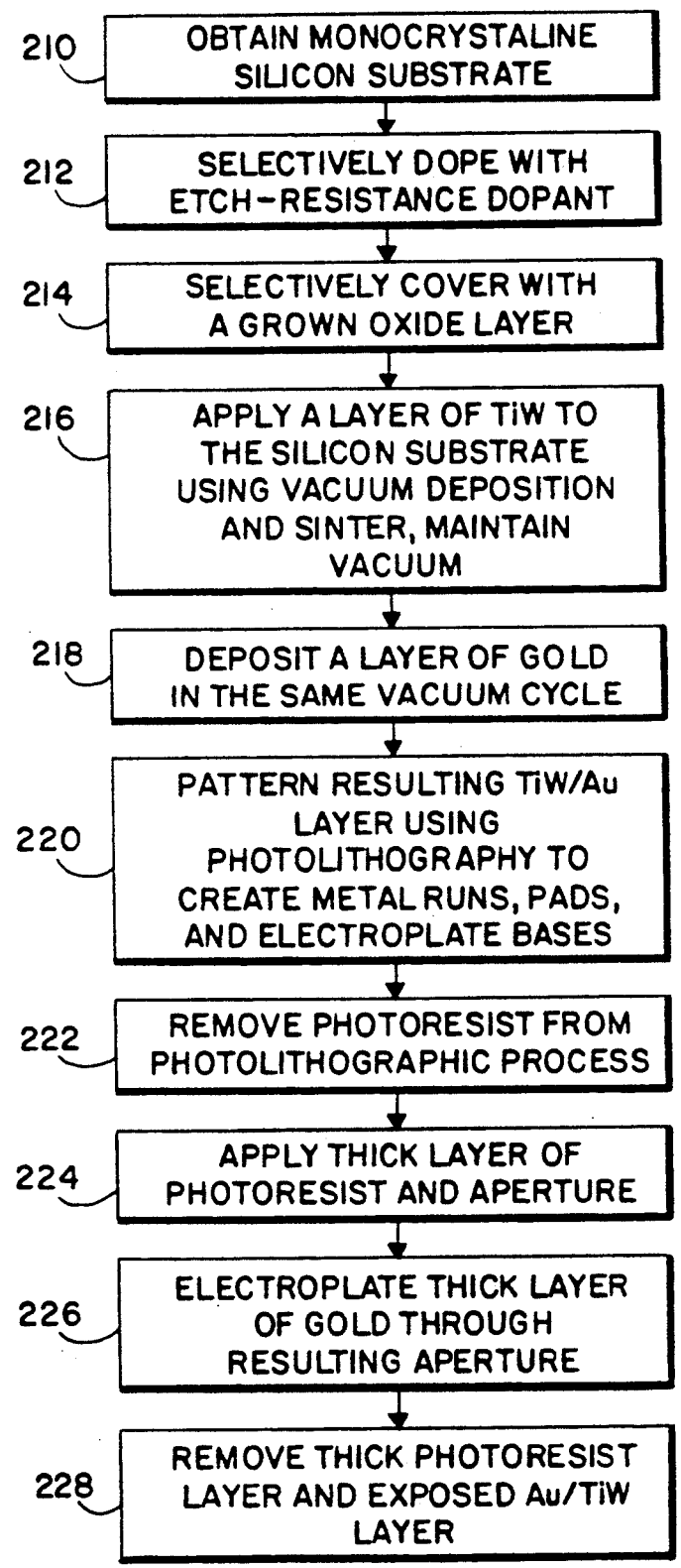
FIG. 13 shows the process steps used to fabricate the structure of FIG. 10.

The fabrication of a metal layer of a bridge is generally described in FIGS. 10-14. FIG. 10 in conjunction with FIG. 13 illustrates the process for the formation of a metal layer over a silicon substrate 112 (210). (Numbers in parentheses indicate process steps.) The silicon layer 112 can be selectively doped (212) to be etch resistant depending upon the application. The applications to an accelerometer or a gyroscope is fully described below. The substrate 112 can be covered or partially covered (214) with a grow oxide (or nitride) layer 114 for purposes of electrical isolation.

To permit the formation of the metallization layer, a first layer 116 of titanium-tungsten alloy (TiW), approximately 1 micron thick, is applied (216) to the substrate 112 by a vacuum deposition technique. The resulting deposition is then sintered. The TiW layer 116 provides good adhesion to the underlying silicon or dielectric and is sufficiently ductile for the application intended. On top of the TiW layer 116, a gold (Au) layer 118 is deposited (218) in the same vacuum cycle, i.e., a vacuum is maintained between deposition steps. The tungsten (W) in the TiW layer 116 substantially prevents gold from diffusing through to the silicon substrate 112 during sintering. The layer 116 is intended both to provide a site upon which a thicker gold layer 126 is to be electroplated, and to provide a metal run for providing electrical contact to the electroplating site. The TiW-/Au layers 116/118 are patterned (220) by photolithography, leaving behind areas of layers 116/118 only where intended to serve as bases for electroplating; metal runs, or bonding pads. A resist layer for this purpose is removed (222) and a thick layer 122 of resist is applied (224) which is then apertured to expose a hole 124 through which a thick layer 126 of gold is electroplated (226) in a bath, using electrical contact provided by layers 116 and 118. The resist layer 122 is removed (228) and the exposed areas of layer 116 are then selectively removed by selective etchants to leave desired conductive leads, if any.

Figure 14:
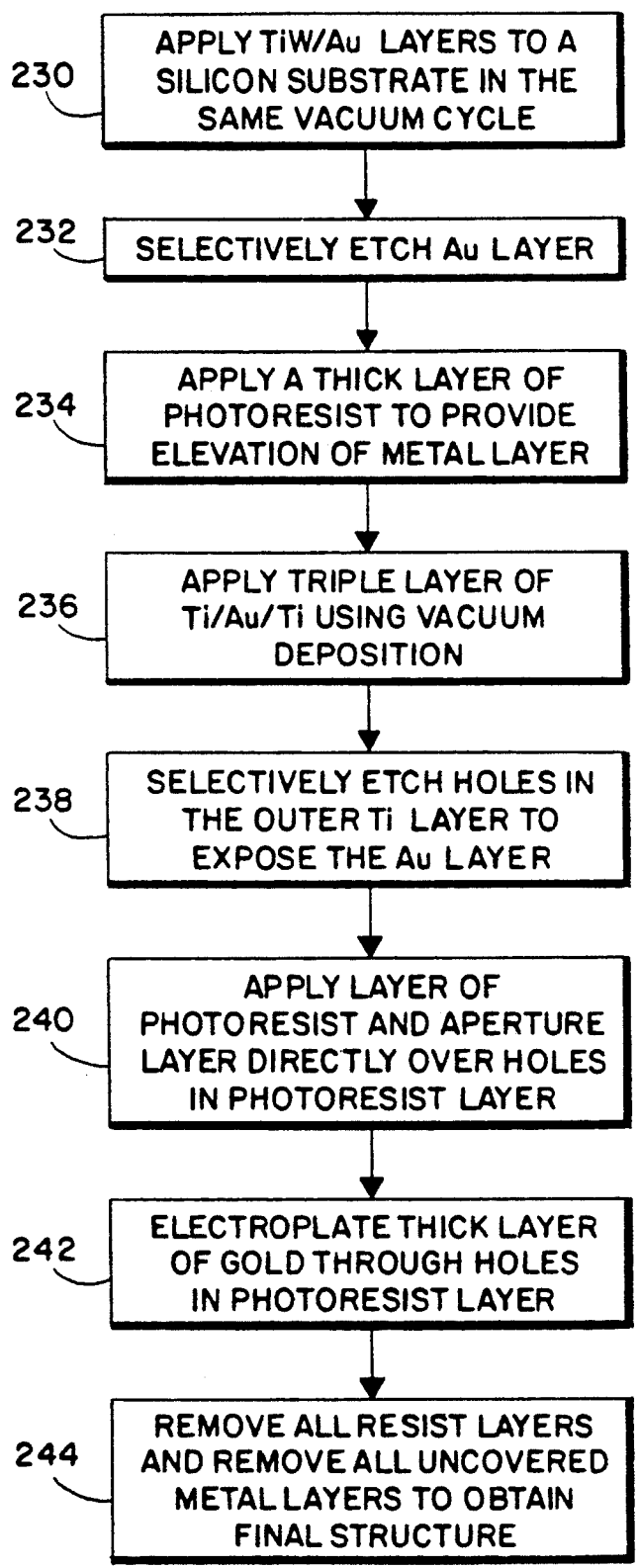
FIG. 14 shows the process steps used to fabricate the structure of FIG. 12.

The fabrication of a thick metallization layer spaced from an underlying silicon layer will now be described with reference to FIGS. 11, 12 and 14. Titanium-tungsten and gold layers 132 and 134 are applied (230) to a silicon substrate 130 in the same vacuum deposition step, and layer 134 is selectively etched (232), all as described above. Next, a thick layer 136 of photoresist is applied (234) in a region where the final metallization layer is to be elevated above the silicon substrate 130 for purposes to be described below. Over the partial resist layer 136 and TiW/Au layers 132/134, a triple set of layers 138, 140 and 142 of titanium, gold, and titanium are applied (236) using vacuum deposition. The outer Ti layer 142, used for adhesion of a subsequently applied and patterned photoresist layer 144, is apertured (238) by etching the exposed titanium in the ares of the photoresist openings 146 exposing the gold layer 140 where a final thick gold metallization layer 148 is to be applied using an electroplating process. Layer 144 is used as the mask to etch hole 146. No separate mask is required. A thick structural gold layer 148 is then electroplated (242) on the gold layer 140 to a thickness of many microns. The resist layers 136 and 144 are then removed (242) along with the uncovered portions of layers 142, 140, 138, and 132 to leave the structure shown in FIG. 12.

Although the system above has been described with titanium, tungsten and gold, other metals can be used. The alternative metals must provide adhesion between each layer, and permit selective etching and plating, and be sufficiently conductive. A system comprising aluminum and silver satisfies these requirements, and can be used in conjunction with an anisotropic silicon etch that does not attack either metal. Further, alternative systems include vanadium/silver/titanium, titanium/silver/titanium, vanadium/palladium/titanium, vanadium/gold/titanium, titanium/copper/titanium, and titanium/nickel/titanium.

Figure 2:
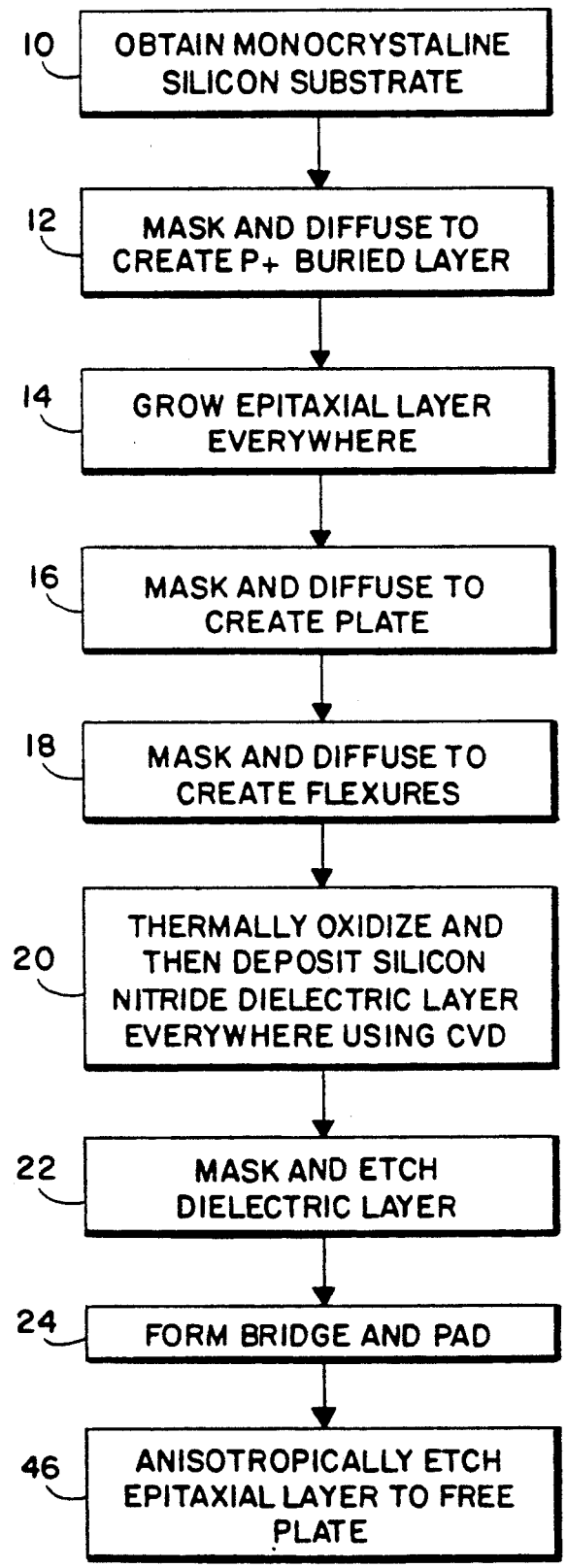
FIG. 2 illustrates the steps for forming the structure of FIG. 1.

Referring again to FIGS. 1 and 2, where numbers in parentheses indicate process steps, a fabrication sequence for the completion of an accelerometer with bridge electrodes will now be described. An N-type silicon substrate 10 is masked and diffused (12) with boron to create a P+ buried layer 2 which serves as buried electrodes 12. An appropriate and common technique for masking the surface of a silicon wafer is to oxidize the surface and then coat it with a photoresist, expose it to light, and wash away the exposed photoresist (assuming a positive photoresist). The resist protects certain portions of the oxide layer, while exposed portions of the oxide layer are typically etched in a solution of buffered HF. The resist is removed and the remaining oxide layer serves to block the diffusion of boron into the silicon substrate 10. Next an additional layer of silicon 14 is epitaxially grown (14) over the entire surface of the wafer with a nominal thickness of 10 microns. To create flexures 16 and the plate 18, the silicon surface is oxidized, apertured photolithographically and then diffused (16, 18) with boron. In the present embodiment, the flexures are created in a separate second diffusion step, and are only one tenth as deep as the plate. In alternate embodiments, a plate and its flexures can be of the same depth, and so can be created in a single step. A passivating dielectric layer 20 is created by thermally oxidizing the surface of the epitaxial layer 14 and then depositing (20) silicon nitride everywhere over the surface using chemical vapor deposition (CVD). The dielectric layer 22 is then masked and etched (22) to form an aperture 22.

Subsequently, using the photolithographic etching and plating process shown above, a bridge electrode 38 and a contact pad 41 of gold are plated over a composite layer 24 comprising five layers: Ti/W, Au, Ti, Au, Ti, with the last Ti layer removed before plating the gold layer.

Finally, after the photoresist is removed with a solvent, the outer Ti/Au/Ti metal layer portion of layer 24 is removed (in all areas not covered by the bridge electrode 38 and pad 41) by etching (42), the photoresist spacer is removed using a solvent, the inner TiW portion of layer 24 is removed, and the region 46 of the epilayer 14 is anisotropically etched (46) using for example, ethylenediamine-pyrocatechol-water to free the plate 18 and its associated flexures 16. The anisotropic etch leaves side walls 48.

Certain structures, such as the microelectromechanical gyroscopes disclosed in FIGS. 3 and 8, may require the inclusion of shielding electrodes under bridge electrodes to shield one of the two monolithic gimbal plates characteristic of gyroscopic instruments from the effects of the metal bridge electrodes. The use of a shielding electrode is not limited to use in conjunction with the microelectromechanical gyroscope as herein disclosed, but can be used with an microelectromechanical device where such shielding can be useful or necessary.

Figure 4:
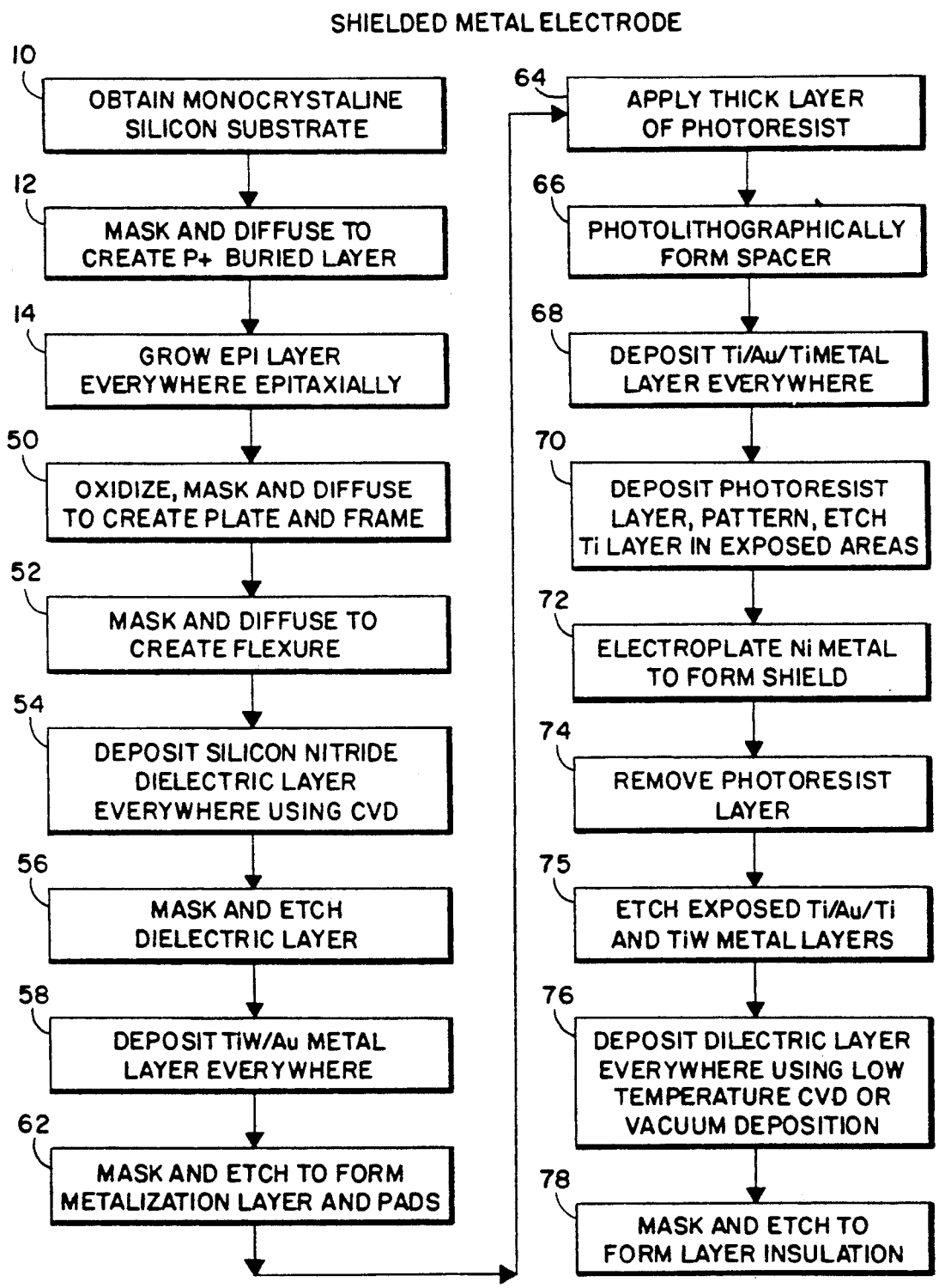
FIGS. 4-5 shows the steps for forming the structure of FIG. 3.
Figure 5:
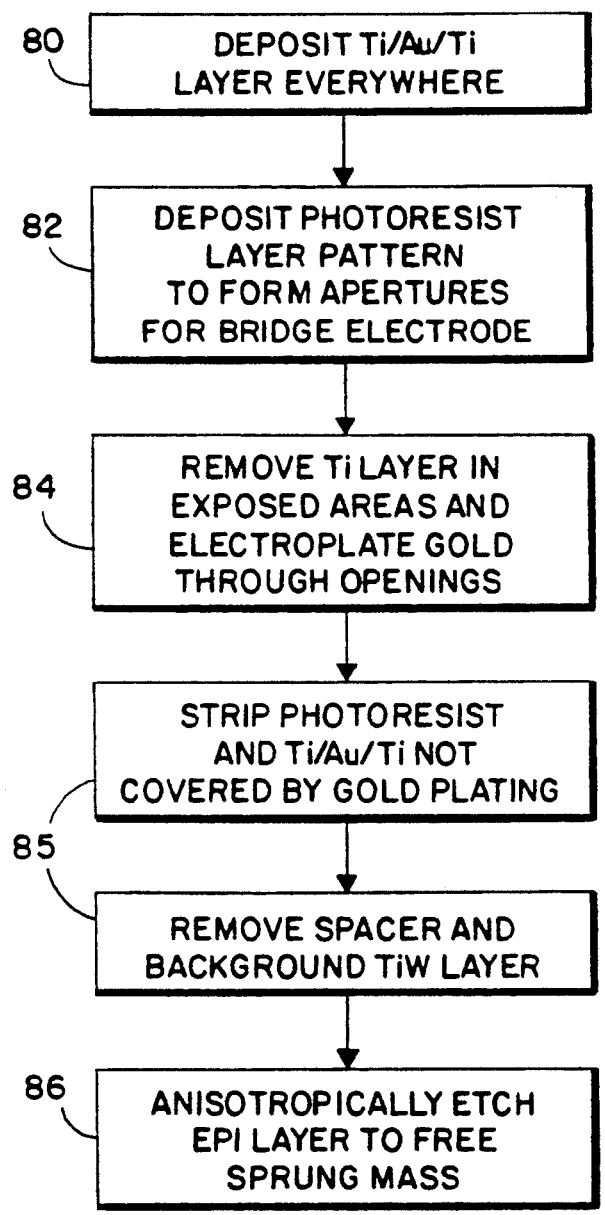

By reference to FIGS. 3 and 4 the construction of shielded bridge electrodes and their process of formation is illustrated. To fabricate the microelectromechanical device that includes a shielded metal bridge electrode, a silicon substrate 10 is masked and diffused (12) to create a P+buried layer 12. Then, an epitaxial layer 14 is grown (14). To create a gimbal system of the microelectromechanical gyro, the top surface of the epitaxial layer 14 is oxidized, photolithographically apertured and diffused (50) with boron through the apertures to define inner and outer gimbal plates 52 and 53. In a subsequent step (52), the flexures 50 and 51 of the gyroscope are similarly created by oxidizing, photolithographically aperturing and diffusing boron to a depth typically only one tenth that of the plate 52. A dielectric layer 54 is then thermally grown or deposited (54) and subsequently masked and etched (56) to create an aperture 56 over the diffused regions 50, 51, 52 and 53.

Thereafter, processing continues as described above. A double layer 58, 62 of TiW/Au metal is then deposited everywhere (58) over the surface. The Au layer 62 on top of the TiW layer 58 is then masked and etched (62) to form a metalization layer which includes pads 62A and 62B. In the next step (64), a thick layer of photoresist is applied to the surface. The layer of photoresist is developed to form a spacer 66. A thin triple layer of Ti/Au/Ti metal 68 is then deposited everywhere (68).

To create gold shields 72, a layer of photoresist is deposited (70) and subsequently masked and etched (70) in the pattern of the shields 72. The newly exposed portions of the topmost Ti metal layer are removed by etching. Nickel (or in an alternate embodiment—gold) is then electroplated (72) through the resulting openings in the resist and topmost Ti metal layers, and onto the Au metal layer of triple layer 68 to form the shields 72. The photoresist layer is then removed (74). Using the plated shield 72 and the gold pads 62 as a mask, the exposed Ti/Au/Ti metal layer 68 and exposed Ti/W metal layer 58 are removed (75). This step (75) is necessary to achieve electrical isolation of the shield 72. Next a dielectric layer 78 consisting of silicon nitride or silicon dioxide is deposited everywhere (76) using low-temperature CVD, or vacuum deposition. This dielectric layer 78 is masked and etched (78) over most of the surface leaving an insulation layer 78, as shown, with appropriate openings to underlying sublayers, such as an opening to the gold contact pads 62A.

A second triple layer 80 of Ti/Au/Ti metal is deposited everywhere (80). This layer will serve as the continuous electrical contact for a second plating layer. Next, a layer of photoresist is deposited (82) which is subsequently photolithographically patterned (82) to form apertures for a bridge electrode 84, thereby exposing portions of a topmost Ti layer of the triple metal layer 80. The exposed portions of the Ti layer are then removed. To form the bridge electrode 84, gold is electroplated (84) within the aperture and over the remaining Au/Ti double metal layer 80. Plating occurs only on the gold layer of double layer 80. The topmost Ti layer is used primarily to improve resist adhesion, and so must be removed from the areas to be plated prior to plating. Finally, the photoresist layer and the corresponding underlying Ti/Au/Ti layer 80 are stripped (85). Then, the spacer 66 and the exposed areas of TiW layer 58 are all removed (85). The pattern of the plated gold serves as a mask for this purpose. Additionally, the region 86 is anisotropically etched (86) to an extent indicated by line 88, thus freeing the plate and frame 52 as well as the flexures 50. Gold runs from contact points 62A and 62B lead to bonding pads (not shown) as described with respect to FIG. 1.

Figure 6:
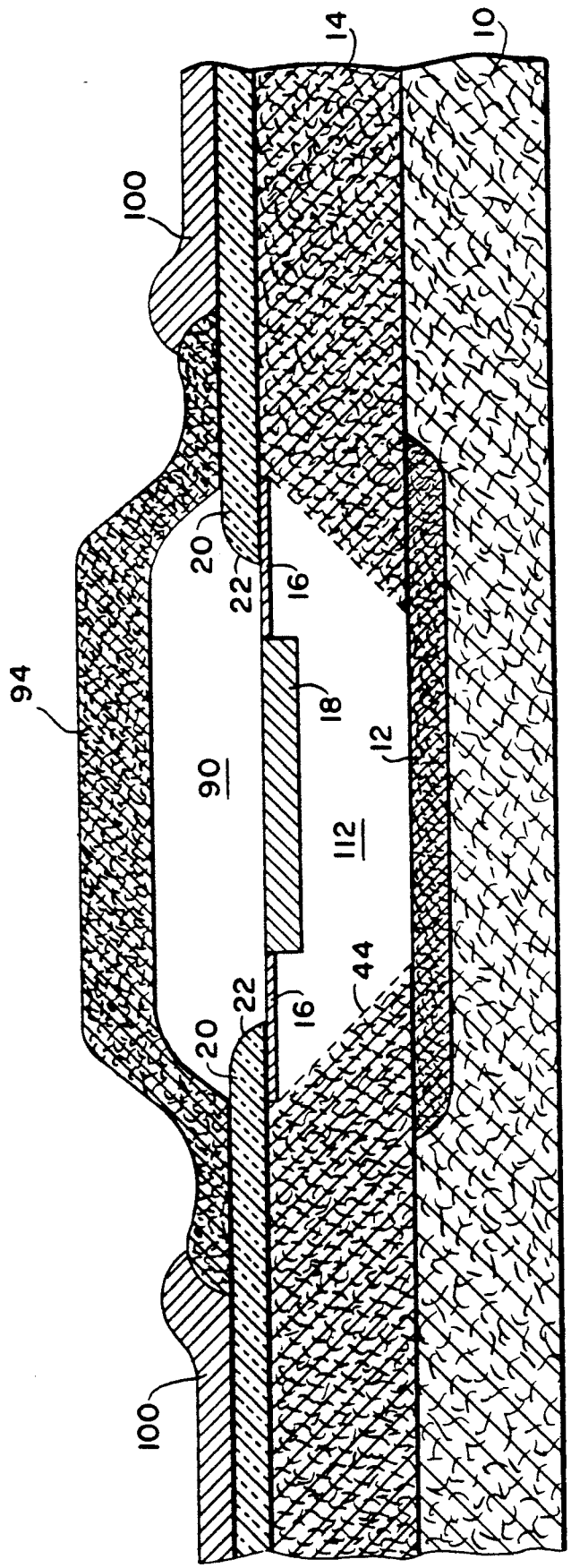
FIG. 6 is a sectional view of a polysilicon bridge electrode.
Figure 7:
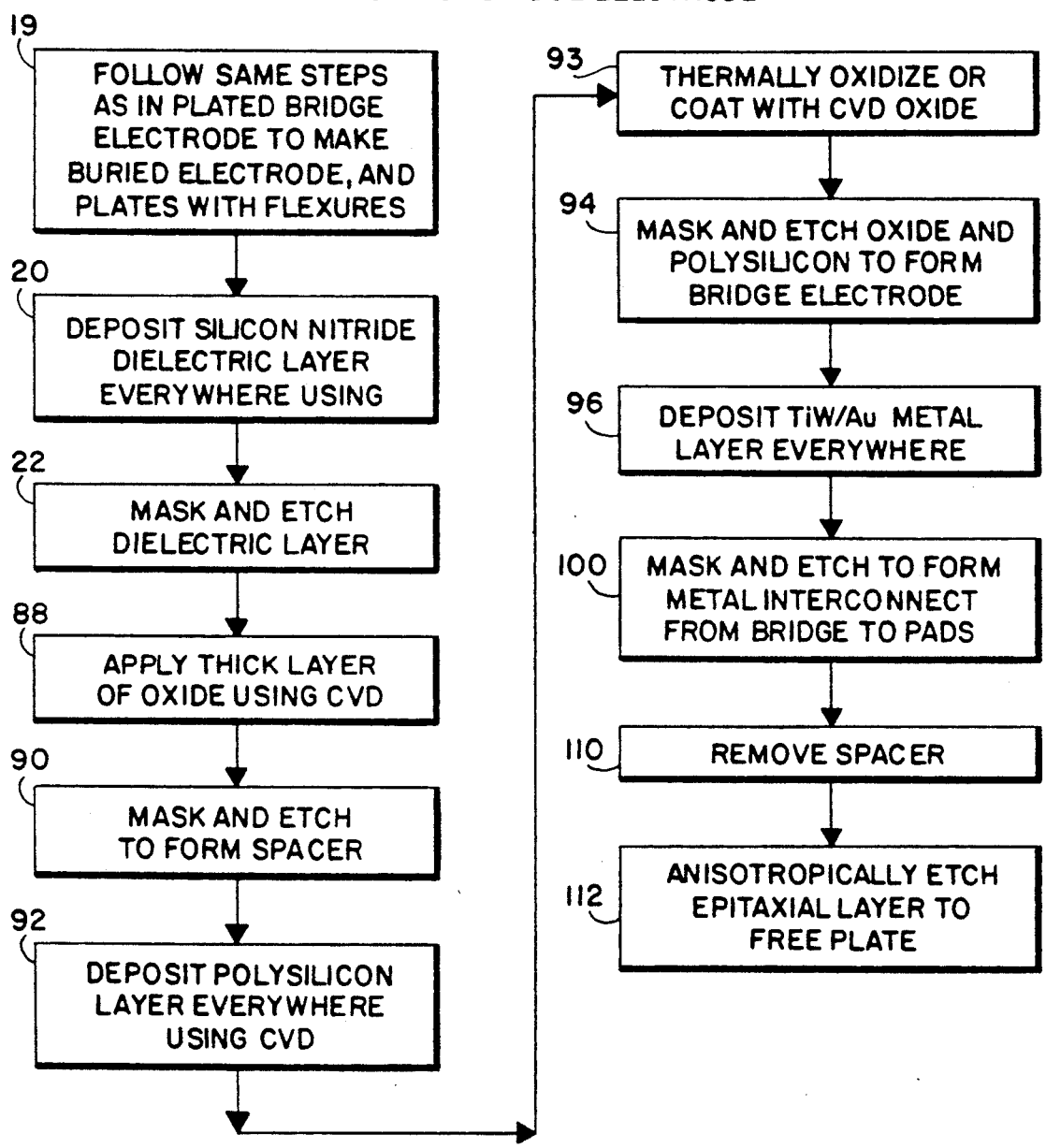
FIG. 7 illustrates the steps for forming the structure of FIG. 6.

The bridge electrodes shown above can be fabricated of polysilicon rather than gold. Such a structure is shown in FIG. 6, and the steps of its formation illustrated in FIG. 7. Initially, the same steps (10), (12), (14), (16) and (18) are executed (19) to form the buried electrodes 12 and the plate 18 with its associated flexures 16 for an accelerometer. A dielectric layer 20, consisting typically of silicon nitride is deposited over the entire surface (20) by CVD. Although a variety of dielectrics and methods can be used with electroplated bridges, in the process of forming a polysilicon bridge electrode it is important that the dielectric layer 20 be a layer consisting essentially of silicon nitride to provide the necessary compatibilities and etch selectivity. The layer 20 is masked and etched (22) to form an aperture 22.

Next, a thick layer of silicon dioxide, which will serve as a sacrificial layer, is deposited (88) by CVD. The oxide layer is then photolithographically masked and etched (90) to form a spacer 90. A polysilicon layer is then deposited over the entire surface (92) using CVD. The surface of the polysilicon layer is then thermally oxidized or coated (93) with a CVD layer of oxide (not shown). The oxide layer so formed is then masked and etched (94) so that the oxide remains only where bridge electrodes 94 are to remain. The exposed polysilicon is then removed. The polysilicon is either deposited with enough dopant to be conductive or is made so by diffusion. The oxide layer on the remaining polysilicon layer 94 is then removed.

A layer of TiW/Au metal is deposited over the entire surface (96). It is then masked and etched (100) to form metal interconnects 100 that connect the polysilicon bridge electrode 94 to bonding pads, typically outside the view of FIG. 6.

Finally, the spacer 90 is removed (110), and a region 112 is anisotropically etched into the silicon 14, using the aforementioned etchant (112) to leave walls 114, freeing the plate 18 and its associated flexures 16.

Figure 9:
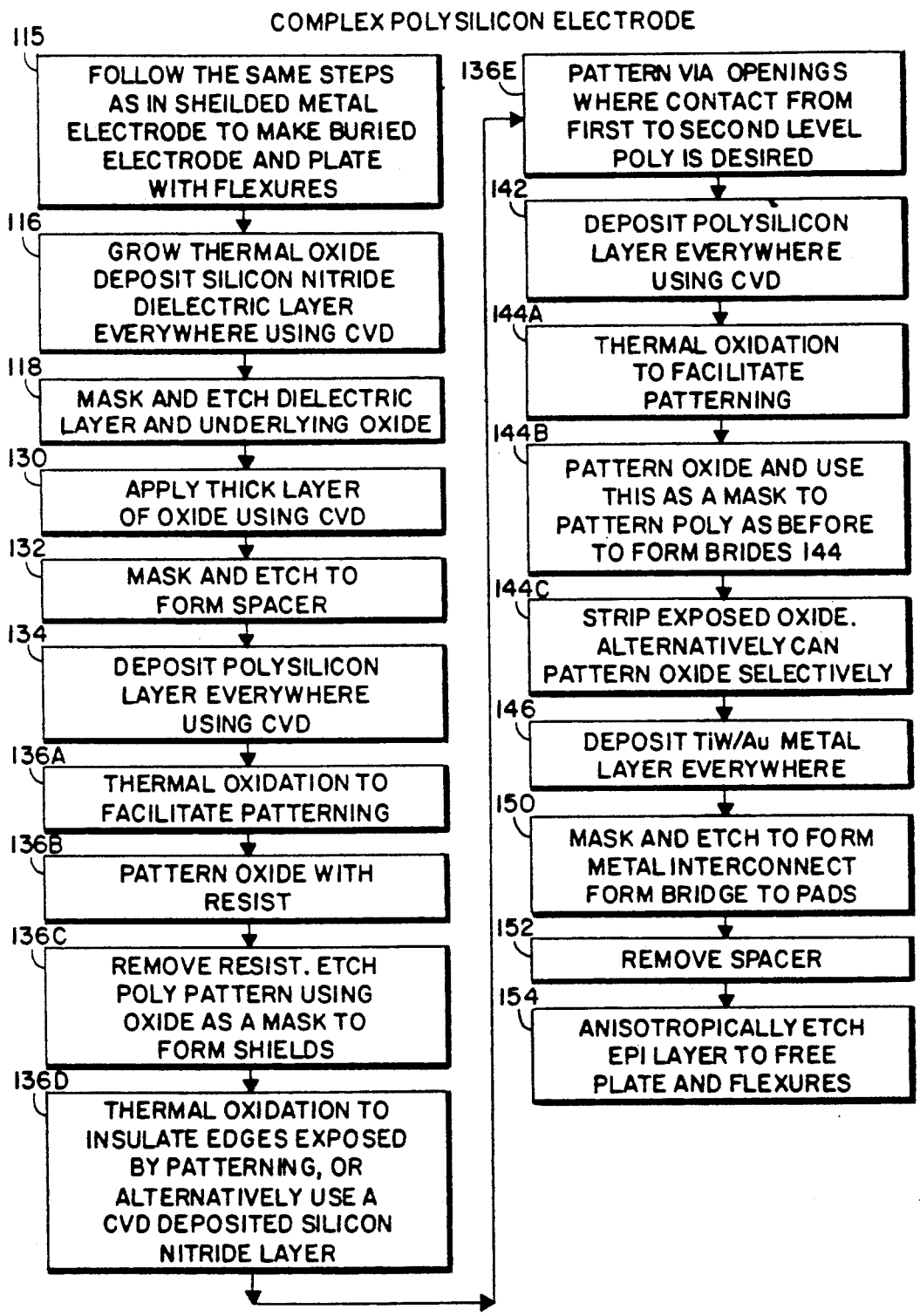
FIG. 9 shows the steps for forming the structure of FIG. 8.

A structure analogous to the shielded metal electrode structure of FIG. 3 can be fabricated using an approach that incorporates a polysilicon bridge electrode. With reference to FIG. 8 in conjunction with the processes shown in FIGS. 9 and 10, the corresponding fabrication sequence will now be discussed.

To make the buried electrode 12, the gimbal plates 52 and 53, and the associated flexures 50 and 51, the same steps are followed (115) as with the shielded metal electrode shown in FIG. 3. Then a thermal oxide is grown and a silicon nitride dielectric layer 116 is deposited everywhere (116), typically using CVD. The dielectric layer 116, including any oxides underneath, is then photolithographically masked and etched (118) to create a aperture 120 for the plates 52, 53 and flexures 50, 51 and an aperture 122 for purpose described below.

Next, a thick layer of oxide is deposited (130) typically using CVD. The thick oxide layer is then photolithographically masked and etched (132) to form a spacer 132.

Next a layer of polysilicon is deposited everywhere (134) using CVD. (All polysilicon layers discussed herein are doped during or after their deposition to render them conductive.) The polysilicon is then surface oxidized (136A) to facilitate patterning. The oxide is patterned (136B) using a layer of photoresist (not shown). The layer of photoresist is then removed and the polysilicon is patterned (136C) using the oxide pattern as an etch mask to form the shields 136. In the same step (136C), other polysilicon areas are created, including a contact 136A through aperture 122 which serves to contact a deep diffusion 50A previously made through aperture 122 to contact the buried layer 12, and layer 136B which is used for connection to other areas, such as an amplifier terminal.

Next, a thermal oxidation (136D) is performed to create an insulating layer 140 around layer 136. Alternatively, an insulator such as silicon nitride can be deposited for this purpose. The insulator is patterned with a layer of photoresist (136E) to create openings for a via 152 to provide electrical contact between a subsequently deposited bridge layer 144 and conductor layer 136B. Otherwise, the two polysilicon layers 144 and 136 are electrically isolated.

Next, a second polysilicon layer is deposited everywhere (142) using CVD. The polysilicon layer is thermally oxidized (144A) to facilitate patterning. The oxide is photolithographically patterned (144B) and the remaining oxide is used as a mask to pattern the polysilicon from which the bridge electrode 144 is to be formed. The remaining polysilicon that constitutes the bridge electrode itself is then used as a mask (144C) to remove unwanted areas of insulator 140. Alternatively a photolithographic step could be used.

A double layer of TiW/Au metal is subsequently deposited everywhere (146), and is then masked and etched (150) to form metal interconnects 150, 150A, and 150B where needed. The double layer can also be used as a base for forming a mass of plated gold, although this process is not shown here.

In general, bridge electrodes in the present embodiment have minimum lead length. FIG. 8 shows the only electrical contact to the bridge electrode 144 is by means of the via 152 to the area 136B. Either the area 136B or the metal run 150A can be used to connect the bridge electrode 144 to an appropriate electrical contact pad. Metal run 150 is shown connecting the shield 136 to a bonding pad (not shown). Metal connections are most easily made to the first polysilicon layer 136, as shown in FIG. 8. However, the invention does not exclude direct metal contact to layer 144.

Lastly, the spacer 132 is removed in step (152), and a region 154 is anisotropically etched using the aforementioned etchant (154) stopping at walls 156 to free the plate 52, 53 and its associated flexures 50 and 51.

Other modifications and additions will occur to those in the art that are nevertheless within the spirit and scope of the invention as claimed.

What is claimed is:

1. A bridge electrode assembly formed by a photolithographic process on a substrate, and for use in conjunction with a microelectromechanical transducer that includes a transducer element, said assembly comprising:

an electrode extending as a bridge from a first point to a second point on a surface of said substrate, and over at least a portion of said transducer element;

a conductor in electrical contact with said bridge electrode operative to provide electrical connection to said bridge electrode;

a buried electrode within said substrate, said buried electrode extending under at least a portion of said transducer element, and confronting said bridge electrode; and a conductor in electrical contact with said buried electrode, for providing electrical connection to said buried electrode, and for providing at least one of balanced application of forces and symmetry for symmetrical motion detection to said transducer element when paired and utilized with said bridge electrode.

2. The bridge electrode assembly of claim 1, further comprising a shielding electrode photolithographically formed between said bridge electrode and said transducer element and extending from said substrate surface over a portion of said transducer element less than the portion over which said bridge electrode extends.

3. The bridge electrode assembly of claim 1 wherein said bridge electrode is fabricated including a conductor selected from the group consisting of polysilicon, gold and nickel.

4. Apparatus for detection of motion of a micromechanical transducer element included in a microelectromechanical transducer formed in a substrate comprising:

an electrode extending as a bridge from a first point to a second point on a surface of said substrate, and over a portion of said transducer;

a conductor in electrical contact with said bridge electrode operative to provide electrical connection to said bridge electrode;

a buried electrode within said substrate, said buried electrode extending under at least a portion of said transducer element, and confronting said bridge electrode; and a conductor in electrical contact with said buried electrode, for providing electrical connection to said buried electrode, and for providing at least one of balanced application of forces and symmetry for symmetrical motion detection to said transducer element when paired and utilized with said bridge electrode.

5. The apparatus of claim 4, further comprising an electrical shielding electrode disposed between said bridge electrode and a portion of said transducer element.

6. Apparatus for application of force to a micromechanical transducer element included in a microelectromechanical transducer formed in a substrate comprising:

an electrode extending as a bridge from a first point to a second point on a surface of said substrate, and over a portion of said transducer;

a conductor in electrical contact with said bridge electrode operative to provide electrical connection to said bridge electrode;

a buried electrode within said substrate, said buried electrode extending under at least a portion of said transducer element, and confronting said bridge electrode; and a conductor in electrical contact with said buried electrode, for providing electrical connection to said buried electrode, and for providing at least one of balanced application of forces and symmetry for symmetrical motion detection to said transducer element when paired and utilized with said bridge electrode.

7. The apparatus of claim 6, further comprising electrical shielding electrode disposed between said bridge electrode and a portion of said transducer element.

8. A bridge electrode assembly formed by a photolithographic process on a substrate, for use in conjunction with a microelectromechanical transducer that includes a transducer element, said assembly comprising:

an electrode extending as a bridge from a first point to a second point on a surface of said substrate, and over at least a portion of said transducer element;

a conductor in electrical contact with said bridge electrode, for providing electrical connection to said bridge electrode; and a shielding electrode disposed between said bridge electrode and said transducer element, and extending from said substrate surface over a portion of said transducer element less than the portion over which said bridge electrode extends.

9. A bridge electrode assembly formed by a photolithographic process on a substrate, for use in conjunction with a microelectromechanical transducer that includes a transducer element, said assembly comprising:

an electrode extending as a bridge from a first point to a second point on a surface of said substrate, and over at least a portion of said transducer element;

a conductor in electrical contact with said bridge electrode, for providing electrical connection to said bridge electrode;

a buried electrode within said substrate, said buried electrode extending under at least a portion of said transducer element, and confronting said bridge electrode;

a conductor in electrical contact with said buried electrode, for providing electrical connection to said buried electrode, for providing at least one of balanced application of forces and symmetry for symmetrical motion detection to said transducer element when paired and utilized with said bridge electrode; and a shielding electrode disposed between said bridge electrode and said transducer element, and extending from said substrate surface over a portion of said transducer element less than the portion over which said bridge electrode extends.

10. A bridge electrode assembly for use in conjunction with a microelectromechanical transducer that includes a transducer element, said assembly comprising:

a substrate in which is formed said transducer including a transducer element;

at least one multi-layered bridge electrode extending from a first point to a second point on a surface of said substrate, and disposed over at least a portion of said transducer element, said multi-layered bridge electrode comprising a plurality of bonded layers, each layer of said bonded, multi-layered bridge electrode comprising one of a plurality of metals; and a conductor in electrical contact with said multi-layered bridge electrode, for providing electrical connection to said multi-layered bridge electrode wherein said assembly further includes a shield layer extending from said substrate surface over a portion of said transducer element for forming a shielding electrode between said bridge electrode and said transducer element.

11. The bridge electrode assembly of claim 10 wherein said plurality of metals are selected from the group consisting of a titanium-tungsten alloy, gold, titanium, vanadium, silver, palladium, copper, and nickel.

12. The bridge electrode assembly of claim 10 further including a buried electrode within said substrate, said buried electrode extending under at least a portion of said transducer element, and confronting said bridge electrode, and for providing at least one of balanced application of forces and symmetry for symmetrical motion detection to said transducer element when paired and utilized with said bridge electrode.

* * * * *

UNITED STATES PATENT AND TRADEMARK OFFICE
CERTIFICATE OF CORRECTION

PATENT NO. : 5,216,490
DATED : June 1, 1993
INVENTOR(S) : Paul Greiff, et al

It is certified that error appears in the above-indentified patent and that said Letters Patent is hereby corrected as shown below:

Column 6, line 68, "to create a" should read --to create an--.

Column 7, line 2, "purpose" should read --purposes--.

Signed and Sealed this

Twenty-fourth Day of May, 1994

Attest:

BRUCE LEHMAN

Attesting Officer     Commissioner of Patents and Trademarks